United States Patent
Kim et al.

(10) Patent No.: US 11,431,296 B2
(45) Date of Patent: Aug. 30, 2022

(54) AMPLIFYING CIRCUIT AND AMPLIFYING DEVICE WITH START-UP FUNCTION

(71) Applicant: Samsung Electro-Mechanics Co., Ltd., Suwon-si (KR)

(72) Inventors: Jong Myeong Kim, Suwon-si (KR); Ju Young Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 27 days.

(21) Appl. No.: 16/987,561

(22) Filed: Aug. 7, 2020

(65) Prior Publication Data

US 2021/0367557 A1 Nov. 25, 2021

(30) Foreign Application Priority Data

May 22, 2020 (KR) .................. 10-2020-0061511

(51) Int. Cl.
| | |
|---|---|
| *H03F 1/30* | (2006.01) |
| *H03F 1/02* | (2006.01) |
| *H03F 3/193* | (2006.01) |
| *H03F 1/56* | (2006.01) |
| *H03F 3/24* | (2006.01) |
| *G05F 3/26* | (2006.01) |

(52) U.S. Cl.
CPC ........... *H03F 1/0222* (2013.01); *G05F 3/262* (2013.01); *H03F 1/56* (2013.01); *H03F 3/193* (2013.01); *H03F 3/245* (2013.01); *H03F 2200/18* (2013.01); *H03F 2200/21* (2013.01); *H03F 2200/222* (2013.01); *H03F 2200/27* (2013.01); *H03F 2200/294* (2013.01); *H03F 2200/387* (2013.01); *H03F 2200/555* (2013.01)

(58) Field of Classification Search
CPC .................................. H03F 1/30; H03F 3/191
USPC .......................................... 330/296, 285, 302
See application file for complete search history.

(56) References Cited

U.S. PATENT DOCUMENTS

| | | | |
|---|---|---|---|
| 9,041,464 B2 * | 5/2015 | Komninakis | H03F 1/0244 330/149 |
| 9,525,389 B2 * | 12/2016 | Hirooka | H03F 3/19 |
| 2010/0201449 A1 | 8/2010 | Hasegawa | |

FOREIGN PATENT DOCUMENTS

| | | |
|---|---|---|
| JP | 2010-183473 A | 8/2020 |
| KR | 10-2010-0097321 A | 9/2010 |

* cited by examiner

*Primary Examiner* — Henry Choe
(74) *Attorney, Agent, or Firm* — NSIP Law

(57) ABSTRACT

An amplifying circuit is provided. The amplifying circuit includes a bias circuit receiving an operating voltage from a power supply circuit and generating a first bias voltage, a resistance circuit connected between the bias circuit and a gate node and transferring the first bias voltage to the gate node, a start-up circuit generating a high-level start-up voltage and supplying the start-up voltage to the gate node before the operating voltage is supplied, based on a control signal, and an amplifier started-up by receiving the start-up voltage and then receiving the operating voltage and the first bias voltage to amplify a high frequency signal input through the gate node.

20 Claims, 6 Drawing Sheets

AMPLIFYING CIRCUIT AND AMPLIFYING DEVICE WITH START-UP FUNCTION

CROSS-REFERENCE TO RELATED APPLICATION(S)

This application claims the benefit under 35 USC § 119(a) of priority to Korean Patent Application No. 10-2020-0061511 filed on May 22, 2020 in the Korean Intellectual Property Office, the entire disclosure of which is incorporated herein by reference for all purposes.

BACKGROUND

1. Field

The following description relates to an amplifying circuit and an amplifying device with a start-up function.

2. Description of Related Art

Typically, in a front-end module (FEM) embedded in a wireless communications device such as a mobile phone, a transmitting unit (or transmitter) and a receiving unit (or receiver) may share a single antenna implementing wireless fidelity (Wi-Fi) communications. Since the receiving unit and the transmitting unit share the antenna according to predetermined times in a time division duplex (TDD) manner, a switching time is important for the FEM.

In an example in which the FEM operates within 200 ns (within 400 ns at maximum) after receiving a control signal for a reception-on operation, the FEM should be operated within the predetermined period of time.

Generally, a low-noise amplifier (LNA) included in the receiving unit of the FEM may not use external power, but may receive an operating voltage through an internal power supply circuit including a bandgap reference (BGR), a low dropout (LDO), or the like.

In an example where the external power is approximately 3 V to 5 V, when the external power is directly applied to the LNA, an element such as an internal complementary metal-oxide-semiconductor (CMOS) transistor may be damaged. Therefore, the internal power supply circuit drops the external power to a stable voltage, and supplies the reduced voltage as the operating voltage (VDD) of the LNA.

In the typical LNA, in an example where the operating voltage (VDD) is supplied through the internal power supply circuit, and a bias voltage is generated by using the operating voltage (VDD), a point in time at which the operating voltage (VDD) is supplied after receiving the control signal may be delayed, and a point in time at which the bias voltage is generated and supplied may be delayed. Therefore, a point in time at which the LNA is operated is delayed, which is problematic.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an amplifying circuit includes a bias circuit, configured to receive an operating voltage from a power supply circuit, and generate a first bias voltage, a resistance circuit, connected between the bias circuit and a gate node, and configured to transfer the generated first bias voltage to the gate node, a start-up circuit, configured to generate a high-level start-up voltage, and supply the generated start-up voltage to the gate node before a supply of the operating voltage, based on a control signal; and an amplifier, configured to start up based on a receipt of the generated start-up voltage, and receive the operating voltage and the first bias voltage to amplify a high frequency signal input through the gate node.

The start-up circuit may be configured to output the generated start-up voltage with a level that is increased to a high level from a point in time at which the control signal has an operation-on level, and is configured to be maintained at the high level until a point in time at which the operating voltage is increased to a high voltage level.

The bias circuit may include a first resistor, a second resistor, and a bias transistor connected in series between an operating voltage terminal and a ground, the bias transistor may include a drain and a gate, which are commonly connected, and a source connected to the gate through a capacitor and connected to the ground, and in the bias circuit, a second bias voltage is output from a first node positioned between the first resistor and the second resistor to the amplifier, and the first bias voltage is supplied from the gate of the bias transistor.

The amplifying circuit may include an input matching circuit connected between an input terminal and the gate node, and configured to transfer the high frequency signal input from the input terminal to the amplifier through the gate node; and an output matching circuit connected between an output node of the amplifier, an operating voltage terminal, and an output terminal, and configured to transfer the operating voltage to the amplifier, and transfer a high frequency signal output from the amplifier to the output terminal.

The amplifier may include a first amplifying transistor and a second amplifying transistor that are connected in cascode between the operating voltage terminal and the ground, the first amplifying transistor may include a gate connected to the gate node, a source connected to the ground, and a drain connected to a source of the second amplifying transistor, and the second amplifying transistor may include a gate through which the second bias voltage is input, the source connected to the drain of the first amplifying transistor, and a drain connected to an output node of the amplifier.

The start-up circuit may include an exclusive disjunction circuit, configured to perform an exclusive disjunction on the control signal and the operating voltage; and a switch element, configured to perform a switching operation based on a switching signal of the exclusive disjunction circuit, and transfer the start-up voltage to the gate node when the switch element is in an ON state.

The first amplifying transistor may be configured to form a current mirror structure together with the bias transistor, a gate length of the first amplifying transistor is equal to a gate length of the bias transistor, and a gate width of the first amplifying transistor and a gate width of the bias transistor have a predetermined ratio, 1:k, where k is a real number equal to or greater than 1.

In a general aspect, an amplifying device includes a power supply circuit, configured to generate an operating voltage in response to a control signal; and an amplifying circuit, configured to receive the generated operating voltage to amplify an input high frequency signal, wherein the amplifying circuit may include a bias circuit, configured to receive the operating voltage from the power supply circuit and generate a first bias voltage; a resistance circuit, connected between the bias circuit and a gate node, and configured to transfer the generated first bias voltage to the gate node; a start-up circuit, configured to generate a high-level start-up voltage, and supply the generated start-up voltage to the gate node before a supply of the operating voltage, based on the control signal; and an amplifier, configured to start up based on a receipt of the start-up voltage, and receive the operating voltage and the first bias voltage to amplify the high frequency signal input through the gate node.

The start-up circuit is configured to output the generated start-up voltage with a level that is increased to a high level from a point in time at which the control signal has an operation-on level, and is configured to be maintained at the high level until a point in time at which the operating voltage is increased to a high voltage level.

The bias circuit may include a first resistor, a second resistor, and a bias transistor connected in series between an operating voltage terminal and a ground, the bias transistor includes a drain and a gate, which are commonly connected, and a source connected to the gate through a capacitor and connected to the ground, and in the bias circuit, a second bias voltage is output from a first node positioned between the first resistor and the second resistor to the amplifier, and the first bias voltage is supplied from the gate of the bias transistor.

The resistance circuit may include a resistor configured to transfer the first bias voltage to the gate node, and configured to suppress the high frequency signal input through the gate node.

The amplifying device may further include an input matching circuit connected between an input terminal and the gate node, and configured to transfer a signal input from the input terminal to the amplifier through the gate node; and an output matching circuit connected between an output node of the amplifier, an operating voltage terminal, and an output terminal, and configured to transfer the operating voltage to the amplifier, and transfer a high frequency signal output from the amplifier to the output terminal.

The amplifier may include a first amplifying transistor and a second amplifying transistor that are connected in cascode between the operating voltage terminal and the ground, the first amplifying transistor may include a gate connected to the gate node, a source connected to the ground, and a drain connected to a source of the second amplifying transistor, and the second amplifying transistor may include a gate through which the second bias voltage is input, the source connected to the drain of the first amplifying transistor, and a drain connected to an output node of the amplifier.

The start-up circuit may include an exclusive disjunction circuit, configured to perform an exclusive disjunction on the control signal and the operating voltage; and a switch element, configured to perform a switching operation based on a switching signal of the exclusive disjunction circuit, and transfer the start-up voltage to the gate node when the switch element is in an ON state.

The first amplifying transistor may be configured to form a current mirror structure together with the bias transistor, a gate length of the first amplifying transistor is equal to a gate length of the bias transistor, and a gate width of the first amplifying transistor and a gate width of the bias transistor have a predetermined ratio, 1:k, where k is a real number equal to or greater than 1.

In a general aspect, a communication terminal includes an amplifying device including a power supply circuit configured to generate an operating voltage in response to a control signal, and an amplifying circuit configured to receive the operating voltage, and amplify a high frequency signal input through an input terminal, wherein the amplifying circuit includes a start-up circuit configured to generate a high-level start-up voltage, and transmit the generated start-up voltage to an amplifier of the amplifying circuit, and wherein the amplifier is configured to start up upon receipt of the start-up voltage, and before the operating voltage is received.

The amplifying circuit may further include a bias circuit, configured to generate a first bias circuit, and the amplifier may be configured to amplify the high frequency signal based on the operating voltage and the first bias voltage.

The start-up circuit may include an exclusive disjunction circuit configured to output a switching signal by performing an exclusive disjunction on the control signal and the operating voltage, and a switch element configured to perform a switching operation based on the switching signal, and transfer the start-up voltage to the amplifier in an ON state.

The amplifying circuit may be one of a low-noise amplifier and a power amplifier.

Other features and aspects will be apparent from the following detailed description, the drawings, and the claims.

Figure 1:
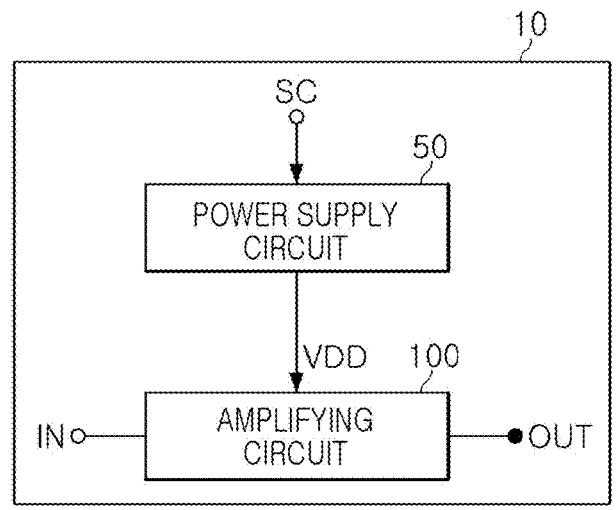
FIG. 1 illustrates an example amplifying circuit and an example amplifying device, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains after an understanding of the disclosure of this application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

FIG. 1 illustrates an example amplifying circuit and an example amplifying device, in accordance with one or more embodiments.

Referring to FIG. 1, an amplifying device 10, in accordance with one or more embodiments, may include a power supply circuit 50 and an amplifying circuit 100.

In an example, the power supply circuit 50 may generate an operating voltage VDD in response to a control signal SC. For example, the control signal SC may be a control signal for operation-on (for example, a reception-on operation or a transmission-on operation). In an example, the control signal SC may be a reception-on control signal or transmission-on control signal in a time division duplex (TDD) wireless communications terminal. The control signal, however, is not limited to the above example. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The amplifying circuit 100 may receive the operating voltage VDD, amplify a high frequency signal input through an input terminal IN, and output the amplified signal through an output terminal OUT. In a non-limiting example, in the TDD wireless communications terminal, the amplifying circuit 100 may include a low-noise amplifier (LNA) or a power amplifier (PA).

In the respective drawings of the present disclosure, an unnecessarily overlapping description of components having the same reference numeral and the same function may be omitted and a difference may be mainly described.

Figure 2:
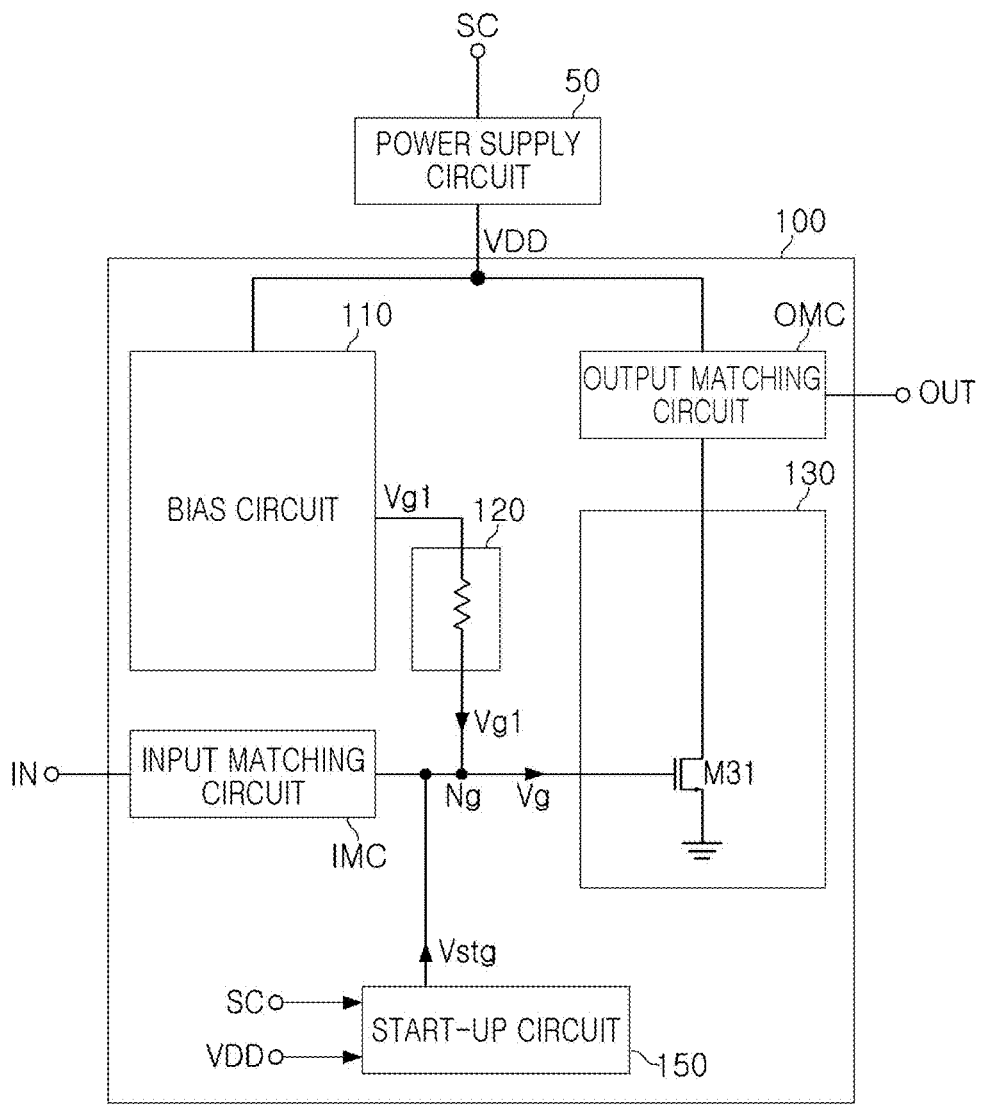
FIG. 2 illustrates an example internal configuration of the amplifying circuit of FIG. 1.

FIG. 2 illustrates an example internal configuration of the amplifying circuit 100 of FIG. 1.

Referring to FIGS. 1 and 2, the amplifying circuit 100 may include a bias circuit 110, a resistance circuit 120, a start-up circuit 150, and an amplifier 130.

The bias circuit 110 may receive the operating voltage VDD from the power supply circuit 50, and generate a first bias voltage Vg1.

The resistance circuit 120 may be connected between the bias circuit 110 and a gate node Ng, and may receive the generated first bias voltage Vg1 from the bias circuit 110, and transfer the received first bias voltage Vg1 to the gate node Ng.

The start-up circuit 150 may generate a high-level start-up voltage Vstg and transmit the generated start-up voltage Vstg to the amplifier 130 through the gate node Ng before the operating voltage VDD is supplied, based on the control signal SC.

In an example, the start-up circuit 150 may output the start-up voltage Vstg, whose level is increased, to a high level from a point in time T1 when the control signal SC has an operation-on level, and may be maintained at the high level until a point in time T2 when the operating voltage VDD is increased to a high voltage level. In an example, the operation-on level may be a high level corresponding to a reception-on level or transmission-on level.

The amplifier 130 may be started-up upon receipt of the start-up voltage Vstg, and may then receive the operating voltage VDD and the first bias voltage Vg1 to amplify a high frequency signal input through the gate node Ng. In an example, the amplifier 130 may include at least a first amplifying transistor M31.

Figure 3:
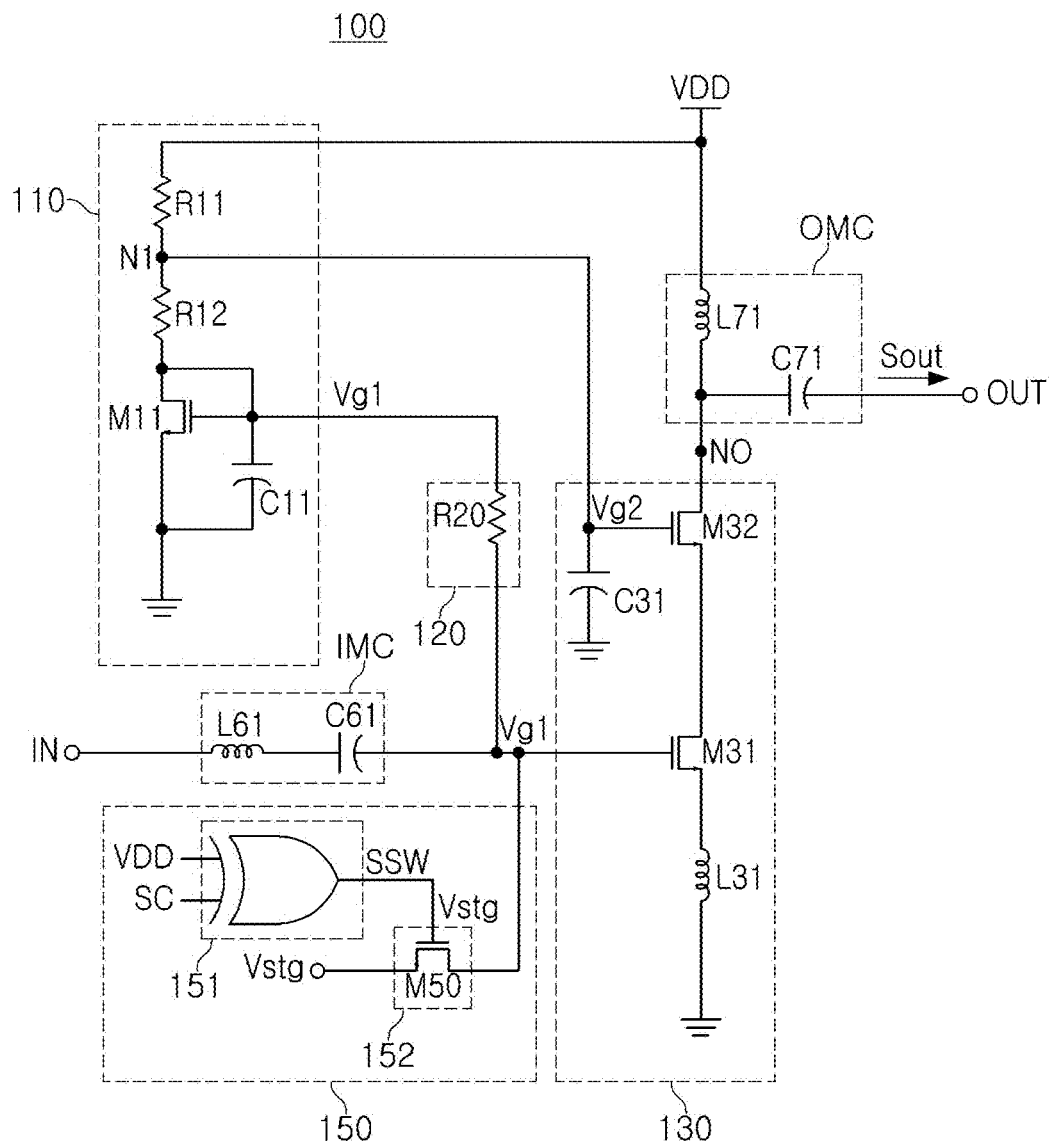
FIG. 3 illustrates an example circuit diagram illustrating the internal configuration of the amplifying circuit of FIG. 1.

FIG. 3 is a detailed circuit diagram illustrating an example of the internal configuration of the amplifying circuit 100 of FIG. 1.

Referring to FIG. 3, the bias circuit 110 may include a first resistor R11, a second resistor R12, and a bias transistor M11 that are connected in series between an operating voltage (VDD) terminal and a ground.

In an example, the bias transistor M11 may include a drain and a gate, commonly connected, and a source connected to the gate through a capacitor C11 and connected to the ground.

In an example, in the bias circuit 110, a second bias voltage Vg2 may be output from a first node N1 positioned between the first resistor R11 and the second resistor R12 to the amplifier 130, and the first bias voltage Vg1 may be transmitted from the gate of the bias transistor M11. However, in an example, the bias circuit 110 may be a circuit that may supply the first and second bias voltages Vg1 and Vg2. Accordingly, the bias circuit 110 is not limited to the above example.

The resistance circuit 120 may include a resistor R20 connected between the bias circuit 110 and the gate node Ng. The resistance circuit 120 may transfer the first bias voltage Vg1 to the gate node Ng, and suppress the high frequency signal input through the gate node Ng.

In an example in which the start-up circuit 150 is not provided, and the first bias voltage Vg1 is transferred to the amplifier through the resistance circuit 120, an increase of a gate voltage of the first amplifying transistor M31 is delayed as much as a delay time according to a time constant determined based on a resistance of the resistance circuit 120 and a parasitic capacitance of the first amplifying transistor M31 included in the amplifier 130, which is disadvantageous.

Each example herein adopts the start-up circuit 150 in order to solve the above disadvantages.

Additionally, referring to FIGS. 2 and 3, the amplifying circuit 100 may include an input matching circuit IMC and an output matching circuit OMC.

The input matching circuit IMC may be connected between the input terminal IN and the gate node Ng, and may transfer a signal input from the input terminal IN to the amplifier 130 through the gate node Ng.

In an example, the input matching circuit IMC may include an inductor L61 and a capacitor C61 connected in series between the input terminal IN and the amplifier 130 for input impedance matching between the input terminal IN and the amplifier 130.

The output matching circuit OMC may be connected between an output node NO of the amplifier 130, the operating voltage (VDD) terminal, and the output terminal OUT. The output matching circuit OMC may transfer the operating voltage VDD to the amplifier 130, and may transfer a high frequency signal from the amplifier 130 to the output terminal OUT.

In an example, the output matching circuit OMC may include an inductor L71 and a capacitor C71 for output impedance matching between the output node NO of the amplifier 130 and the output terminal OUT. In an example, the inductor L71 may be connected between the output node NO of the amplifier 130 and the operating voltage (VDD) terminal, and may supply the operating voltage VDD to the amplifier 130. The capacitor C71 may be connected between the output node NO of the amplifier 130 and the output terminal OUT, and may transfer the high frequency signal output from the amplifier 130 to the output terminal OUT.

In an example, the amplifier 130 may include the first amplifying transistor M31, and a second amplifying transistor M32 that are connected in cascode between the operating voltage (VDD) terminal and the ground.

In an example, the first amplifying transistor M31 may include a gate connected to the gate node Ng, a source connected to the ground through an inductor L31, and a drain connected to a source of the second amplifying transistor M32. In an example, the first amplifying transistor M31 may be started-up by receiving the start-up voltage Vstg through the gate node Ng, and may then receive the first bias voltage Vg1 to perform an amplifying operation.

The second amplifying transistor M32 may include a gate through which the second bias voltage Vg2 is input, a source connected to the drain of the first amplifying transistor M31, and a drain connected to the output node NO of the amplifier 130. In an example, the second amplifying transistor M32 may be operated by receiving the second bias voltage Vg2.

In an example, the start-up circuit 150 may include an exclusive disjunction switch 151 and a switch element 152.

The exclusive disjunction circuit 151 may output a switching signal SSW by performing an exclusive disjunction on the control signal SC and the operating voltage VDD.

The switch element 152 may perform a switching operation according to the switching signal SSW of the exclusive disjunction circuit 151 and transfer the start-up voltage Vstg to the gate node Ng when the switch element 152 is in an ON state.

Further, the first amplifying transistor M31 may form a current mirror structure together with the bias transistor M11. In an example, a gate length of the first amplifying transistor M31 may be the same as a gate length of the bias transistor M11, and a gate width of the first amplifying transistor M31 and a gate width of the bias transistor M11 may have a predetermined ratio (1:k, where k is a real number of 1 or more).

In an example, once the control signal SC is input to operate the amplifying device 10, the power supply circuit 50 supplies the operating voltage VDD. The operating voltage VDD may be supplied to the amplifier 130 of the amplifying circuit 100, and the bias circuit 110 may supply the respective first and second bias voltages Vg1 and Vg2 to the respective gates of the first and second amplifying transistors M31 and M32, with the operating voltage VDD.

As described above, in addition to a driving time of the power supply circuit 50, the resistance circuit 120 connected to an output terminal of the bias circuit may delay a switching time for operation of the amplifier 130, which is disadvantageous.

In order to solve such a disadvantage, the start-up voltage Vstg may be transmitted to the first amplifying transistor M31 of the amplifier 130 to start-up the first amplifying transistor M31 before the operating voltage VDD is applied to the amplifier 130, and then the power supply circuit 50 may apply the operating voltage VDD to the amplifier 130, thereby enabling the amplifier 130 to be rapidly operated.

Additionally, referring to FIG. 3, the start-up circuit 150 may supply the start-up voltage Vstg to the amplifier 130 from the point in time T1 when the control signal SC is supplied until the operating voltage VDD is supplied, such that the amplifier 130 is started-up in advance to prepare for operation. Then, once the operating voltage VDD is supplied, the amplifier 130 may perform the amplifying operation immediately.

Figure 4:
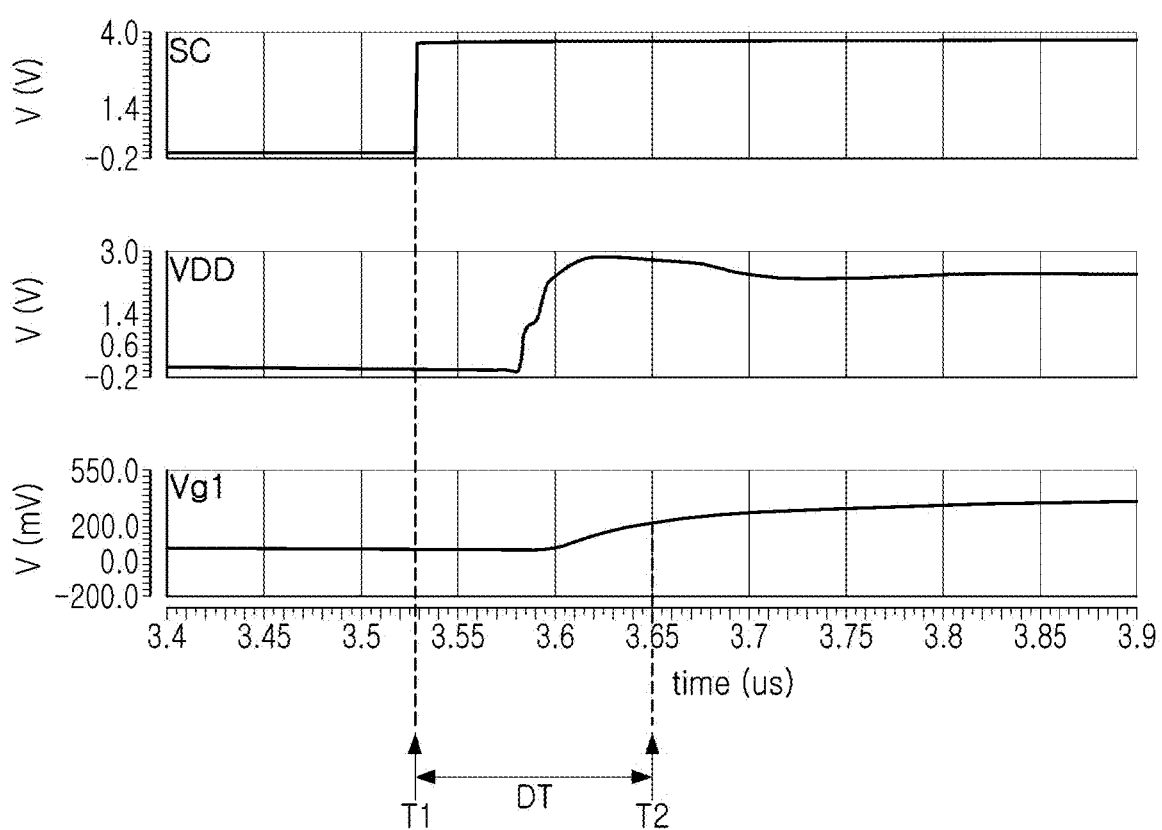
FIG. 4 is a point in time chart illustrating main signals and voltages of an example amplifying device without the start-up circuit, in accordance with one or more embodiments.
Figure 5:
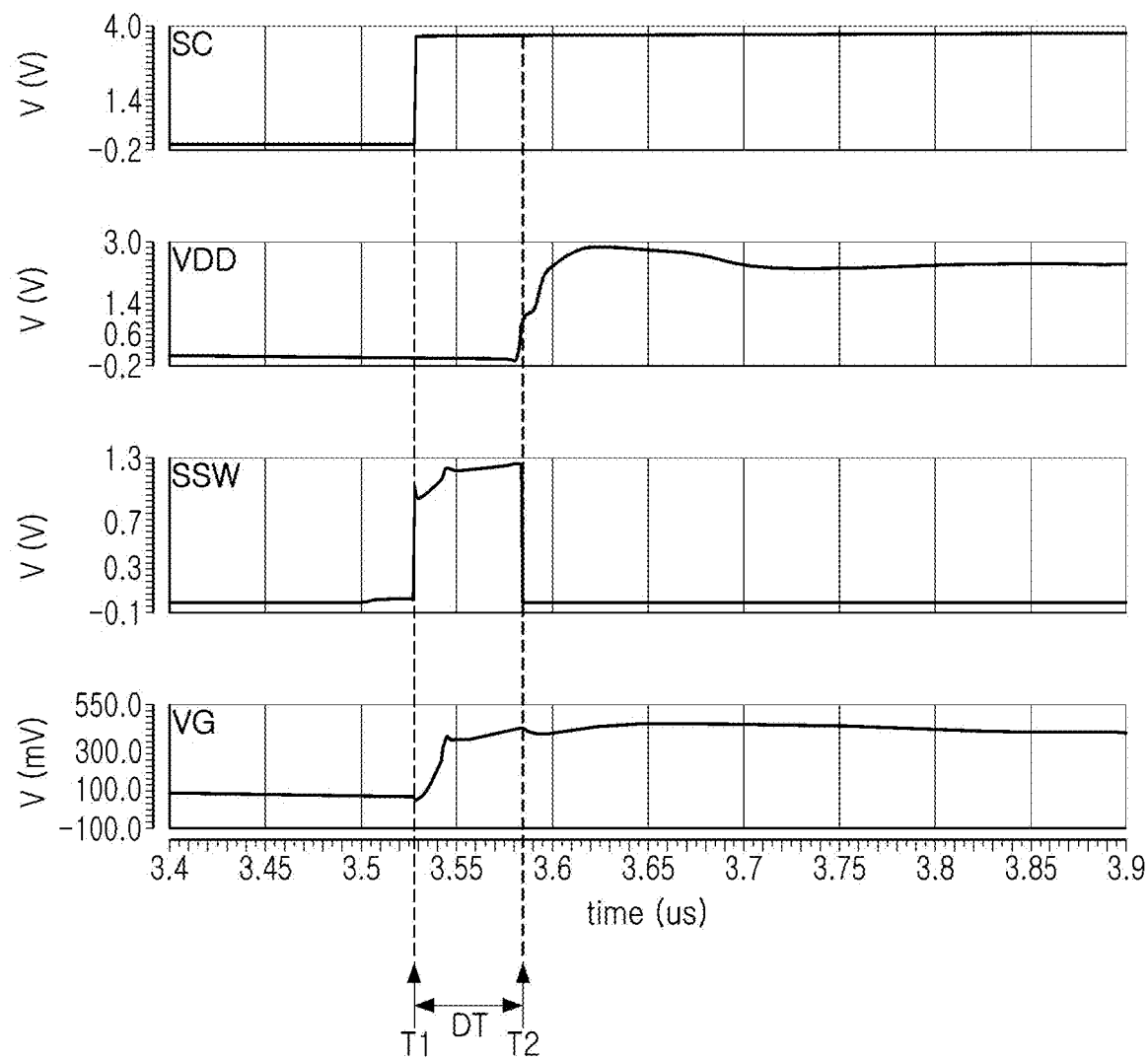
FIG. 5 is a point in time chart illustrating main signals and voltages of an example amplifying device with the start-up circuit, in accordance with one or more embodiments.

FIG. 4 is a point in time chart illustrating main signals and voltages of an example amplifying device without the start-up circuit, and FIG. 5 is a point in time chart illustrating main signals and voltages of an example amplifying device with the start-up circuit.

Referring to FIG. 4, in an example, in the amplifying device without the start-up circuit, once the control signal SC has the operation-on level, the operating voltage VDD may be supplied after a predetermined period of time, and the first bias voltage Vg1 may be supplied with the operating voltage VDD. In an example, the operation-on level may be a high level corresponding to a reception-on level or transmission-on level.

It may be appreciated that, with such an operation process, a long delay time DT (approximately 0.15 μsec) may be necessary from the point in time T1 when the control signal SC is supplied to the point in time T2 when the first bias voltage Vg1 is increased to a high level.

Referring to FIG. 5, in the amplifying device with the start-up circuit, the start-up circuit 150 sets the switching signal SSW to an ON state to supply the start-up voltage Vstg from a point in time at which the control signal SC has the operation-on level to a point in time at which the operating voltage VDD is supplied, such that a gate voltage VG may be increased to a high level in advance by the start-up voltage Vstg. As a result, once the operating voltage VDD is supplied, the amplifier 130 may be operated immediately. In an example, the operation-on level may be a high level corresponding to a reception-on level or transmission-on level.

It may be appreciated that, with such an operation process, a short delay time DT (approximately 0.05 μsec) is required from the point in time T1 when the control signal SC is supplied to the point in time T2 when the first bias voltage Vg1 is increased to a high level.

Figure 6:
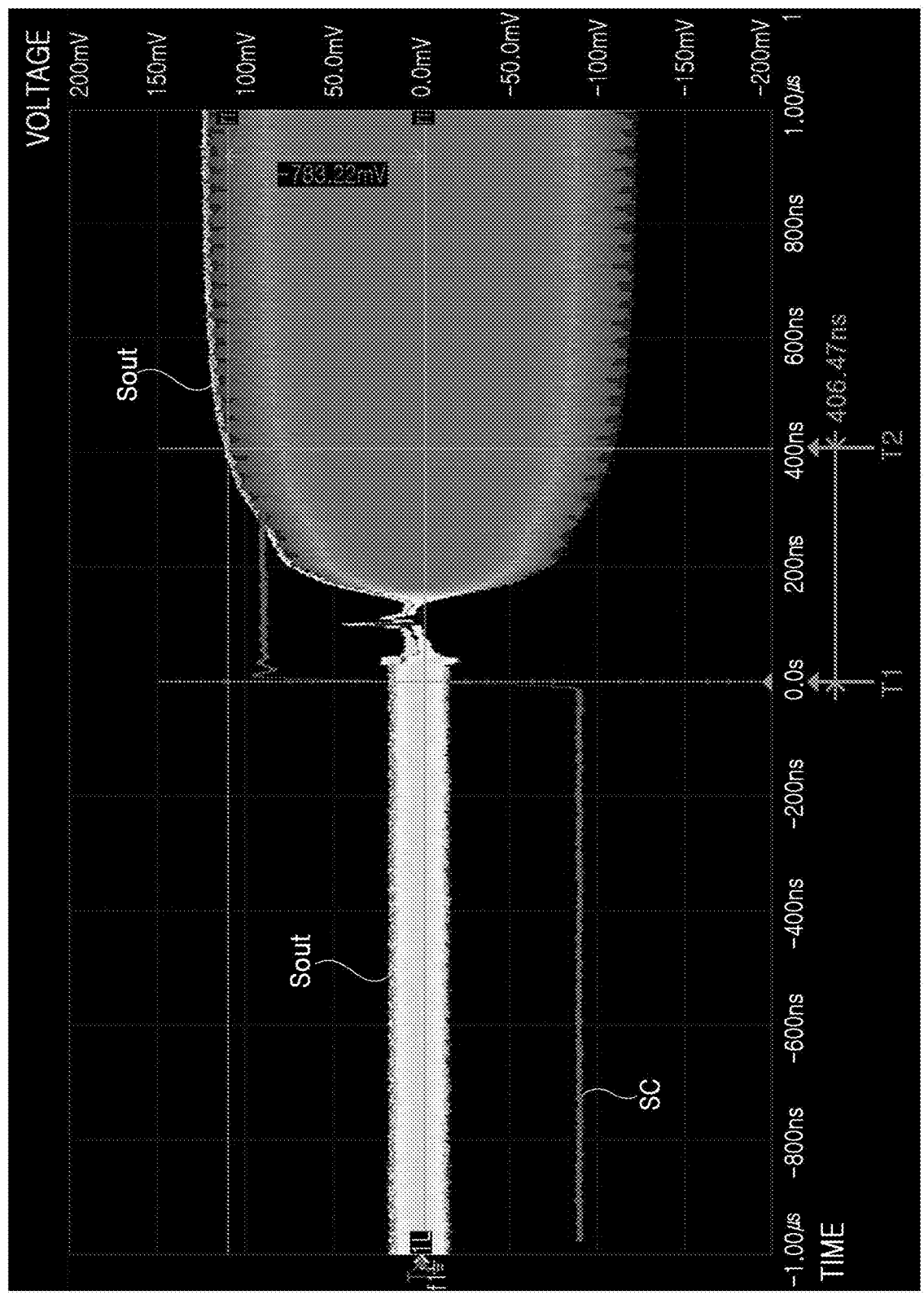
FIG. 6 is a response characteristic graph of an example amplifying device without the start-up circuit, in accordance with one or more embodiments.
Figure 7:
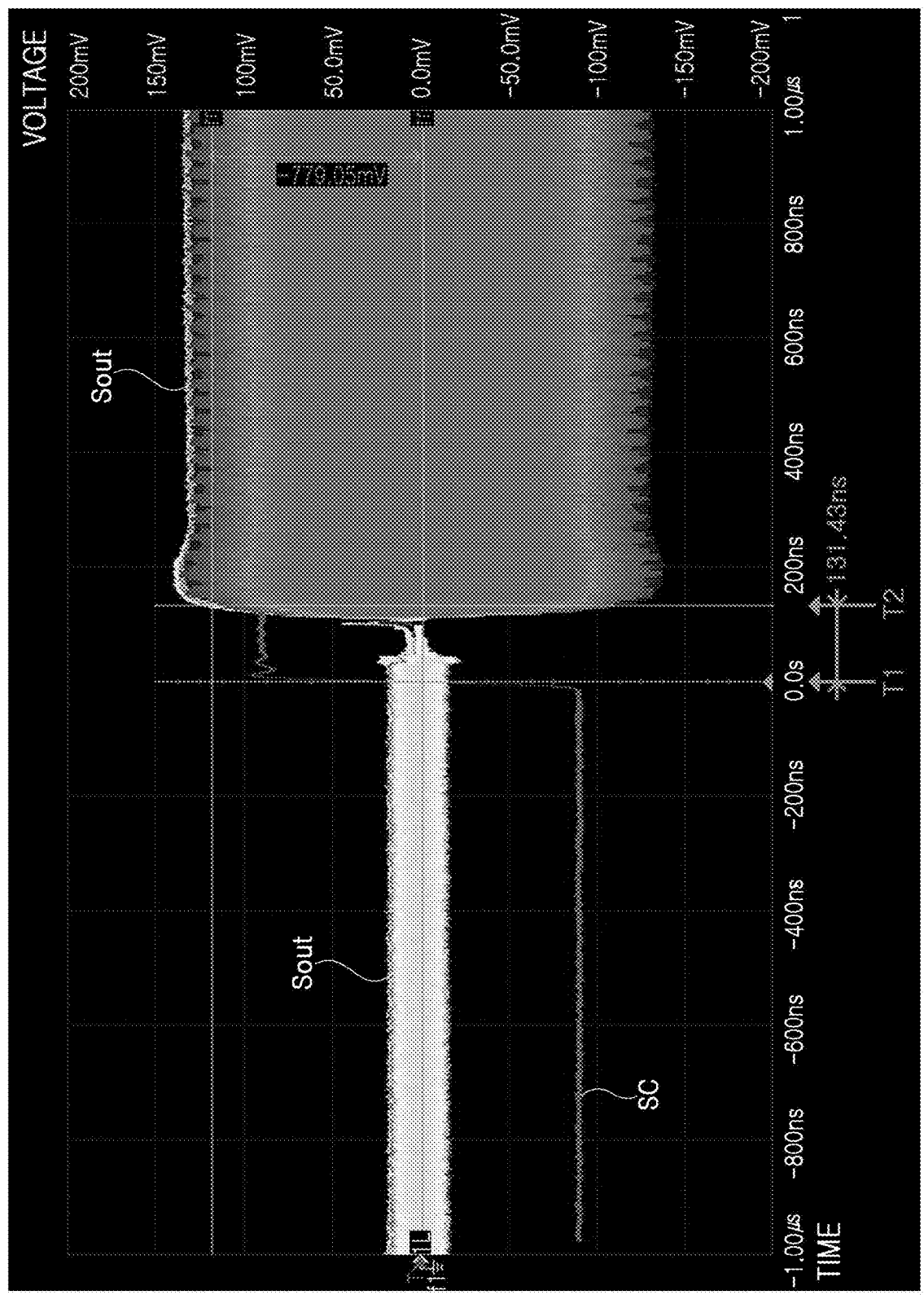
FIG. 7 is a response characteristic graph of an example amplifying device with the start-up circuit, in accordance with one or more embodiments.

FIG. 6 is a response characteristic graph of the example amplifying device without the start-up circuit, and FIG. 7 is a response characteristic graph of the example amplifying device with the start-up circuit.

In FIGS. 6 and 7, it is assumed that T1 is a point in time at which the control signal SC is supplied, T2 is a point in time at which an output signal Sout of the amplifying device 10 is output, and a time between two points in time (T1 and T2) is a response time. Referring to FIG. 6, it may be appreciated that a response time of the amplifying device without the start-up circuit is approximately 405.47 nsec. On the other hand, a response time of the amplifying device with the start-up circuit is approximately 131.43 nsec, which indicates that the amplifying device according to the present disclosure has an improved response time.

As set forth above, according to the examples, the start-up voltage for start-up may be supplied before supplying the operating voltage based on the control signal for operation-on, thereby enabling the amplifying circuit to be more rapidly operated.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An amplifying circuit comprising:
    a bias circuit, configured to receive an operating voltage from a power supply circuit which generates the operating voltage in response to a control signal, and generate a first bias voltage;
    a resistance circuit, connected between the bias circuit and a gate node, and configured to transfer the generated first bias voltage to the gate node;
    a start-up circuit, configured to generate a high-level start-up voltage, and supply the generated start-up voltage to the gate node before the operating voltage is supplied, based on the control signal; and
    an amplifier, configured to start up based on a receipt of the generated start-up voltage, and receive the operating voltage and the first bias voltage to amplify a high frequency signal input through the gate node,
    wherein the start-up circuit is connected between an input matching circuit and the amplifier.

2. The amplifying circuit of claim 1, wherein the start-up circuit is configured to output the generated start-up voltage with a level that is increased to a high level from a point in time at which the control signal has an operation-on level, and is configured to be maintained at the high level until a point in time at which the operating voltage is increased to a high voltage level.

3. The amplifying circuit of claim 1, wherein the bias circuit includes a first resistor, a second resistor, and a bias transistor connected in series between an operating voltage terminal and a ground,
    the bias transistor includes a drain and a gate, which are commonly connected, and a source connected to the gate through a capacitor and connected to the ground, and
    in the bias circuit, a second bias voltage is output from a first node positioned between the first resistor and the second resistor to the amplifier, and the first bias voltage is supplied from the gate of the bias transistor.

4. The amplifying circuit of claim 1, wherein the resistance circuit includes a resistor configured to transfer the first bias voltage to the gate node, and configured to suppress the high frequency signal input through the gate node.

5. The amplifying circuit of claim 1, further comprising:
    the input matching circuit, which is connected between an input terminal and the gate node, and configured to transfer the high frequency signal input from the input terminal to the amplifier through the gate node; and
    an output matching circuit connected between an output node of the amplifier, an operating voltage terminal, and an output terminal, and configured to transfer the operating voltage to the amplifier, and transfer a high frequency signal output from the amplifier to the output terminal.

6. The amplifying circuit of claim 3, wherein the amplifier includes a first amplifying transistor and a second amplifying transistor that are connected in cascode between the operating voltage terminal and the ground,
    the first amplifying transistor includes a gate connected to the gate node, a source connected to the ground, and a drain connected to a source of the second amplifying transistor, and
    the second amplifying transistor includes a gate through which the second bias voltage is input, the source connected to the drain of the first amplifying transistor, and a drain connected to an output node of the amplifier.

7. The amplifying circuit of claim 1, wherein the start-up circuit includes:
    an exclusive disjunction circuit, configured to perform an exclusive disjunction on the control signal and the operating voltage; and
    a switch element, configured to perform a switching operation based on a switching signal of the exclusive disjunction circuit, and transfer the start-up voltage to the gate node when the switch element is in an ON state.

8. The amplifying circuit of claim 6, wherein the first amplifying transistor is configured to form a current mirror structure together with the bias transistor,
    a gate length of the first amplifying transistor is equal to a gate length of the bias transistor, and
    a gate width of the first amplifying transistor and a gate width of the bias transistor have a predetermined ratio, 1:k, where k is a real number equal to or greater than 1.

9. An amplifying device comprising:
    a power supply circuit, configured to generate an operating voltage in response to a control signal; and an amplifying circuit, configured to receive the generated operating voltage to amplify an input high frequency signal, wherein the amplifying circuit includes:

a bias circuit, configured to receive the operating voltage from the power supply circuit and generate a first bias voltage;

a resistance circuit, connected between the bias circuit and a gate node, and configured to transfer the generated first bias voltage to the gate node;

a start-up circuit, configured to generate a high-level start-up voltage, and supply the generated start-up voltage to the gate node before a supply of the operating voltage, based on the control signal; and an amplifier, configured to start up based on a receipt of the start-up voltage, and receive the operating voltage and the first bias voltage to amplify the high frequency signal input through the gate node.

10. The amplifying device of claim 9, wherein the start-up circuit is configured to output the generated start-up voltage with a level that is increased to a high level from a point in time at which the control signal has an operation-on level, and is configured to be maintained at the high level until a point in time at which the operating voltage is increased to a high voltage level.

11. The amplifying device of claim 9, wherein the bias circuit includes a first resistor, a second resistor, and a bias transistor connected in series between an operating voltage terminal and a ground, the bias transistor includes a drain and a gate, which are commonly connected, and a source connected to the gate through a capacitor and connected to the ground, and in the bias circuit, a second bias voltage is output from a first node positioned between the first resistor and the second resistor to the amplifier, and the first bias voltage is supplied from the gate of the bias transistor.

12. The amplifying device of claim 9, wherein the resistance circuit includes a resistor configured to transfer the first bias voltage to the gate node, and configured to suppress the high frequency signal input through the gate node.

13. The amplifying device of claim 9, further comprising:

an input matching circuit connected between an input terminal and the gate node, and configured to transfer a signal input from the input terminal to the amplifier through the gate node; and an output matching circuit connected between an output node of the amplifier, an operating voltage terminal, and an output terminal, and configured to transfer the operating voltage to the amplifier, and transfer a high frequency signal output from the amplifier to the output terminal.

14. The amplifying device of claim 11, wherein the amplifier includes a first amplifying transistor and a second amplifying transistor that are connected in cascode between the operating voltage terminal and the ground, the first amplifying transistor includes a gate connected to the gate node, a source connected to the ground, and a drain connected to a source of the second amplifying transistor, and the second amplifying transistor includes a gate through which the second bias voltage is input, the source connected to the drain of the first amplifying transistor, and a drain connected to an output node of the amplifier.

15. The amplifying device of claim 9, wherein the start-up circuit includes:

an exclusive disjunction circuit, configured to perform an exclusive disjunction on the control signal and the operating voltage; and a switch element, configured to perform a switching operation based on a switching signal of the exclusive disjunction circuit, and transfer the start-up voltage to the gate node when the switch element is in an ON state.

16. The amplifying device of claim 14, wherein the first amplifying transistor is configured to form a current mirror structure together with the bias transistor, a gate length of the first amplifying transistor is equal to a gate length of the bias transistor, and a gate width of the first amplifying transistor and a gate width of the bias transistor have a predetermined ratio, 1:k, where k is a real number equal to or greater than 1.

17. A communication terminal comprising:

an amplifying device comprising:

a power supply circuit configured to generate an operating voltage in response to a control signal, and an amplifying circuit configured to receive the operating voltage, and amplify a high frequency signal input through an input terminal, wherein the amplifying circuit comprises a start-up circuit configured to generate a high-level start-up voltage, and transmit the generated start-up voltage to an amplifier of the amplifying circuit based on the control signal, wherein the amplifier is configured to start up upon receipt of the start-up voltage, and before the operating voltage is received, and wherein the start-up circuit is connected between an input matching circuit and the amplifier.

18. The communication terminal of claim 17, wherein the amplifying circuit further comprises a bias circuit, configured to generate a first bias circuit, and the amplifier is configured to amplify the high frequency signal based on the operating voltage and the first bias voltage.

19. The communication terminal of claim 17, wherein the start-up circuit comprises:

an exclusive disjunction circuit configured to output a switching signal by performing an exclusive disjunction on the control signal and the operating voltage, and a switch element configured to perform a switching operation based on the switching signal, and transfer the start-up voltage to the amplifier in an ON state.

20. The communication terminal of claim 17, wherein the amplifying circuit is one of a low-noise amplifier and a power amplifier.

* * * * *